(12) United States Patent
Yoon et al.

(10) Patent No.: US 7,652,949 B2
(45) Date of Patent: Jan. 26, 2010

(54) MEMORY MODULE AND REGISTER WITH MINIMIZED ROUTING PATH

(75) Inventors: Chil-Nam Yoon, Suwon-si (KR); Young-Man Ahn, Yongin-si (KR); Young-Jun Park, Anyang-si (KR); Sung-Joo Park, Anyang-si (KR)

(73) Assignee: Samsung Electronics Co., Ltd. (KR)

( * ) Notice: Subject to any disclaimer, the term of this patent is extended or adjusted under 35 U.S.C. 154(b) by 297 days.

(21) Appl. No.: 11/633,353

(22) Filed: Dec. 4, 2006

(65) Prior Publication Data

US 2007/0127304 A1    Jun. 7, 2007

(30) Foreign Application Priority Data

Dec. 7, 2005  (KR) .................. 10-2005-0118603

(51) Int. Cl.
*G11C 8/18* (2006.01)

(52) U.S. Cl. .............................. 365/233.11; 365/233.1; 365/233.12; 365/233.13; 365/194; 365/154

(58) Field of Classification Search .............. 365/233.1, 365/233.11, 233.12, 233.13, 194, 154
See application file for complete search history.

(56) References Cited

U.S. PATENT DOCUMENTS

| | | | | |
|---|---|---|---|---|
| 5,896,341 | A | * | 4/1999 | Takahashi .............. 365/230.02 |
| 6,141,292 | A | * | 10/2000 | Lee et al. ................ 365/233.12 |
| 6,661,092 | B2 | | 12/2003 | Shibata et al. |
| 7,113,446 | B2 | * | 9/2006 | Fujisawa ................ 365/189.15 |
| 7,319,635 | B2 | * | 1/2008 | Ahn et al. ............... 365/233.12 |
| 2002/0003747 | A1 | * | 1/2002 | Yahata et al. ................ 365/233 |
| 2003/0025540 | A1 | * | 2/2003 | Nishio et al. ................. 327/158 |
| 2003/0031060 | A1 | * | 2/2003 | Nishio et al. ........... 365/189.12 |
| 2003/0221044 | A1 | * | 11/2003 | Nishio et al. .................... 711/4 |
| 2005/0097264 | A1 | | 5/2005 | Park et al. |
| 2005/0174878 | A1 | | 8/2005 | Osaka et al. |

FOREIGN PATENT DOCUMENTS

KR    20030010528 A    2/2003
KR    20050041531 A    5/2005

\* cited by examiner

*Primary Examiner*—VanThu Nguyen
*Assistant Examiner*—Eric Wendler
(74) *Attorney, Agent, or Firm*—Mills & Onello, LLP

(57) ABSTRACT

A memory module includes a first memory group including a plurality of memory devices, a second memory group including a less number of memory devices with respect to the memory devices in the first memory group, a register configured to provide a command/address signal to the first memory group and a delayed command/address signal to the second memory group, a first signal line configured to transfer the command/address signal to the first memory group, and a second signal line configured to transfer the delayed command/address signal to the second memory group.

25 Claims, 10 Drawing Sheets

MEMORY MODULE AND REGISTER WITH MINIMIZED ROUTING PATH

CROSS-REFERENCE TO RELATED APPLICATIONS

This application claims priority under 35 USC §119 to Korean Patent Application No. 10-2005-0118603 filed on Dec. 7, 2005, in the Korean Intellectual Property Office, the disclosure of which is incorporated herein in its entirety by reference.

BACKGROUND OF THE INVENTION

1. Field of the Invention

The present invention relates to a memory module, and more particularly to a memory module having a register.

2. Description of the Related Art

Generally, a memory module has a plurality of memory devices, and a plurality of memory modules are used as a main memory in computers. In order for a central processing unit (CPU) or a memory controller to directly provide a command/address signal to all of the memory devices, the CPU or the memory controller needs to have a high driving capability for driving the command/address signal. As the number of the memory devices receiving the command/address signal is increased, signal integrity can be degenerated so that the number of the memory devices is required to be reduced.

Thus, a memory module including a plurality of memory devices and a register, which provides a command/address signal to the plurality of memory devices, are used in a computer. The CPU or the memory controller provides the command/address signal to the register included in the memory module, instead of directly to all of the memory devices. Accordingly, in case of the computer including the plurality of memory modules, the CPU or the memory controller provides the command/address signal to only the register in each memory module instead of directly to all of the memory devices.

The memory module having the register generally uses an odd number of memory devices or an odd number of pairs of memory devices. Generally, in the memory module having the register, the register is arranged at the central part of the memory module to minimize a delay amount of the command/address signal. In other words, the memory devices are divided into two groups and the register, hereinafter referred to as a 1:2 register, has a 1:2 configuration. That is, one input terminal and two output terminals are used to provide the command/address signal to each of the groups of memory devices. If the number of the memory devices corresponds to an odd number, numbers of the memory devices included in the two memory groups can be different from each other. For example, in the case where the memory module includes nine memory devices, a first memory group can include five memory devices and a second memory group can include four memory devices. Accordingly, the command/address signal provided to the first memory group cannot be synchronized with the command/address signal provided to the second memory group. Such a mismatch can be insignificant in the memory module that operates at low speed, but can cause trouble in the memory module that operates at high speed.

FIG. 1 is a block diagram illustrating a conventional memory module having a register. Referring to FIG. 1, a memory module 100 includes nine memory devices 121 through 129 and a register 110.

The register 110 receives a command/address signal through a command/address signal input line 101 from the exterior of the memory module 100. The register 110 provides the command/address signal to a first memory group through a first signal line 131 and a first node Na, and provides the command/address signal to a second memory group through a second signal line 132 and a second node Nb. The first memory group includes five memory devices 121, 122, 123, 124 and 125, and the second memory group includes four memory devices 126, 127, 128 and 129.

The number of memory devices coupled to the first signal line 131 is larger than the number of memory devices coupled to the second signal line 132, so that a delay amount of the first signal line 131 is larger than a delay amount of the second signal line 132, that is, a mismatch is caused.

In order to reduce the mismatch, a length L1 of the first signal line 131 can be shorter than a length L2 of the second signal line 132. In order words, the first signal line 131 can be arranged with the shortest routing path from the register 110 to the first node Na, and the second signal line 132 can be arranged with a longer routing path with respect to the first signal line 131.

FIG. 2 is a block diagram illustrating a 1:2 register included in the memory module in FIG. 1. Referring to FIG. 2, a 1:2 register 200 includes a clock buffer 210, an input buffer 220, a D-type flip-flop 230, and first and second output buffers 240 and 241. The clock buffer 210 is provided with an external clock signal CLK. The input buffer 220 is provided with a command/address signal ADDIN from the exterior. The D-type flip-flop 230 outputs the command/address signal in synchronization with the clock signal outputted from the clock buffer 210. The first and second output buffers 240 and 241 buffer the command/address signal outputted from the D-type flip-flop 230. The first output buffer 240 provides the command/address signal to the first memory group, and the second output buffer 241 provides the command/address signal to the second memory group.

Accordingly, signal integrity can be improved by the register in the memory module, and the mismatch can be minimized by lengthening the routing path of the second signal line. However, a lengthened routing path of the second signal line can result in an increase of an area of the memory module. For example, in case that the command/address signal corresponds to a 20-bit signal and the routing path of the command/address signal transfers the 20-bit signal in parallel, the area of the memory module can be increased in proportion to the length of the routing path. Furthermore, when the routing path of the signal line is lengthened, interference between signals can be increased.

Therefore, the routing path of the signal line in a memory module is needed to be minimized.

SUMMARY OF THE INVENTION

In accordance with some aspects of the present invention provided is a memory module having a command/address signal line of a short routing path.

In accordance with some aspects of the present invention provided a register included in a memory module having a command/address signal line of a short routing path.

In accordance with some aspects of the present invention provided is a memory system including a memory module having a command/address signal line of a short routing path.

In accordance with a first aspect of the invention, provided is a register that includes a first latch circuit, a second latch and a clock supply circuit. The first latch circuit can be configured to temporarily store a command/address signal. The second latch circuit can be configured to temporarily store the command/address signal. The clock supply circuit can be configured to generate a first clock signal that is provided to the first latch circuit, and a second clock signal that is delayed with respect to the first clock signal and provided to the second latch circuit, wherein the first latch circuit outputs the command/address signal in synchronization with the first clock signal, and the second latch circuit outputs the command/address signal in synchronization with the second clock signal.

The first latch circuit and the second latch circuit can each include a plurality of D-type flip-flops.

The register can further include a first output buffer and a second output buffer. The first output buffer can be configured to buffer the command/address signal outputted from the first latch circuit, and the second output buffer can be configured to buffer the command/address signal outputted from the second latch circuit.

The clock supply circuit can include a first path and a second path. The first path can receive an external clock signal to provide the first clock signal to the first latch circuit, and the second path can receive the external clock signal to provide the second clock signal to the second latch circuit.

The first path can include a first clock buffer configured to receive the external clock signal to output the first clock signal, and the second path can include a second clock buffer configured to receive the external clock signal to output the second clock signal and a delay circuit configured to delay the second clock signal.

The external clock signal can correspond to a differential signal.

The register can have a configuration of one input terminal and two output terminals configured to receive one command/address signal and output two command/address signals.

In accordance with another aspect of the invention, provided is a memory module that includes a first memory group, a second memory group, a register, a first signal line and a second signal line. The first memory group includes a plurality of memory devices, and the second memory group includes a number of memory devices less than the number of the memory devices in the first memory group. The register is configured to provide a command/address signal to the first memory group and a delayed command/address signal to the second memory group. The first signal line is configured to transfer the command/address signal to the first memory group, and the second signal line is configured to transfer the delayed command/address signal to the second memory group.

The second signal line can be shorter than the first signal line.

The register can include a first latch, a second latch and a clock supply circuit. The first latch circuit can be configured to temporarily store the command/address signal, and the second latch circuit can be configured to temporarily store the command/address signal. The clock supply circuit can be configured to generate a first clock signal that is provided to the first latch circuit, and a second clock signal that is delayed with respect to the first clock signal and provided to the second latch circuit, wherein the first latch circuit can be configured to output the command/address signal in synchronization with the first clock signal, and the second latch circuit can be configured to output the delayed command/address signal in synchronization with the second clock signal.

The first latch circuit and the second latch circuit can each include a plurality of D-type flip-flops.

The register can further include a first output buffer and a second output buffer. The first output buffer can be configured to buffer the command/address signal outputted from the first latch circuit, and the second output buffer can be configured to buffer the delayed command/address signal outputted from the second latch circuit.

The clock supply circuit can include a first path and a second path. The first path can be configured to receive an external clock signal to provide the first clock signal to the first latch circuit, and the second path can be configured to receive the external clock signal to provide the second clock signal to the second latch circuit.

The first path can include a first clock buffer configured to receive the external clock signal to output the first clock signal, and the second path can include a second clock buffer configured to receive the external clock signal to output the second clock signal, and a first delay circuit configured to delay the second clock signal.

The first path can further include a second delay circuit configured to delay the first clock signal.

The external clock signal can correspond to a differential signal.

In accordance with another aspect of the invention, provided is a memory system that includes a memory module and a memory controller. The memory module includes a first memory group, a second memory group, a register, a first signal line and a second signal line. The first memory group includes a plurality of memory devices, and the second memory group includes a number of memory devices less than the number of the memory devices in the first memory group. The register receives a command/address signal from the exterior and provides the command/address signal to the first memory group and a delayed command/address signal to the second memory group. The first signal line is configured to transfer the command/address signal to the first memory group, and the second signal line is configured to transfer the delayed command/address signal to the second memory group. The memory controller is configured to provide the command/address signal from the exterior to the register.

The second signal line can be shorter than the first signal line.

The register can include a first latch circuit, a second latch circuit and a clock supply circuit. The first latch circuit can be configured to temporarily store a command/address signal, and the second latch circuit can be configured to temporarily store the command/address signal. The clock supply circuit can be configured to generate a first clock signal that is provided to the first latch circuit, and a second clock signal that is delayed with respect to the first clock signal and provided to the second latch circuit, wherein the first latch circuit outputs the command/address signal in synchronization with the first clock signal, and the second latch circuit outputs the delayed command/address signal in synchronization with the second clock signal.

The first latch circuit and the second latch circuit can each include a plurality of D-type flip-flops.

The register can further include a first output buffer and a second output buffer. The first output buffer can be configured to buffer the command/address signal outputted from the first latch circuit, and the second output buffer can be configured to buffer the delayed command/address signal outputted from the second latch circuit.

The clock supply circuit can include a first path and a second path. The first path can be configured to receive an external clock signal to provide the first clock signal to the first latch circuit, and the second path can be configured to receive the external clock signal to provide the second clock signal to the second latch circuit.

The first path can include a first clock buffer configured to receive the external clock signal to output the first clock signal, and the second path can include a second clock buffer configured to receive the external clock signal to output the second clock signal, and a first delay circuit can be configured to delay the second clock signal. The first path can further include a second delay circuit can be configured to delay the first clock signal.

The external clock signal can correspond to a differential signal.

As described above, a memory module according to example embodiments of the present invention can be implemented to have a command/address signal line of a short routing path so that the memory module can have a small area. Accordingly, interference between signals can be reduced.

Further, a register according to example embodiments of the present invention can provide a command/address signal and a delayed command/address signal so that a routing path of a command/address signal line can be minimized.

BRIEF DESCRIPTION OF THE DRAWINGS

Various aspects of the invention will become more apparent in view of the attached drawing figures, which are provided by way of example, not by way of limitation, wherein like elements are represented by like reference numerals, which are given by way of illustration only and thus do not limit the example embodiments of the present invention, wherein.

DESCRIPTION OF THE EMBODIMENTS

Figure 1:
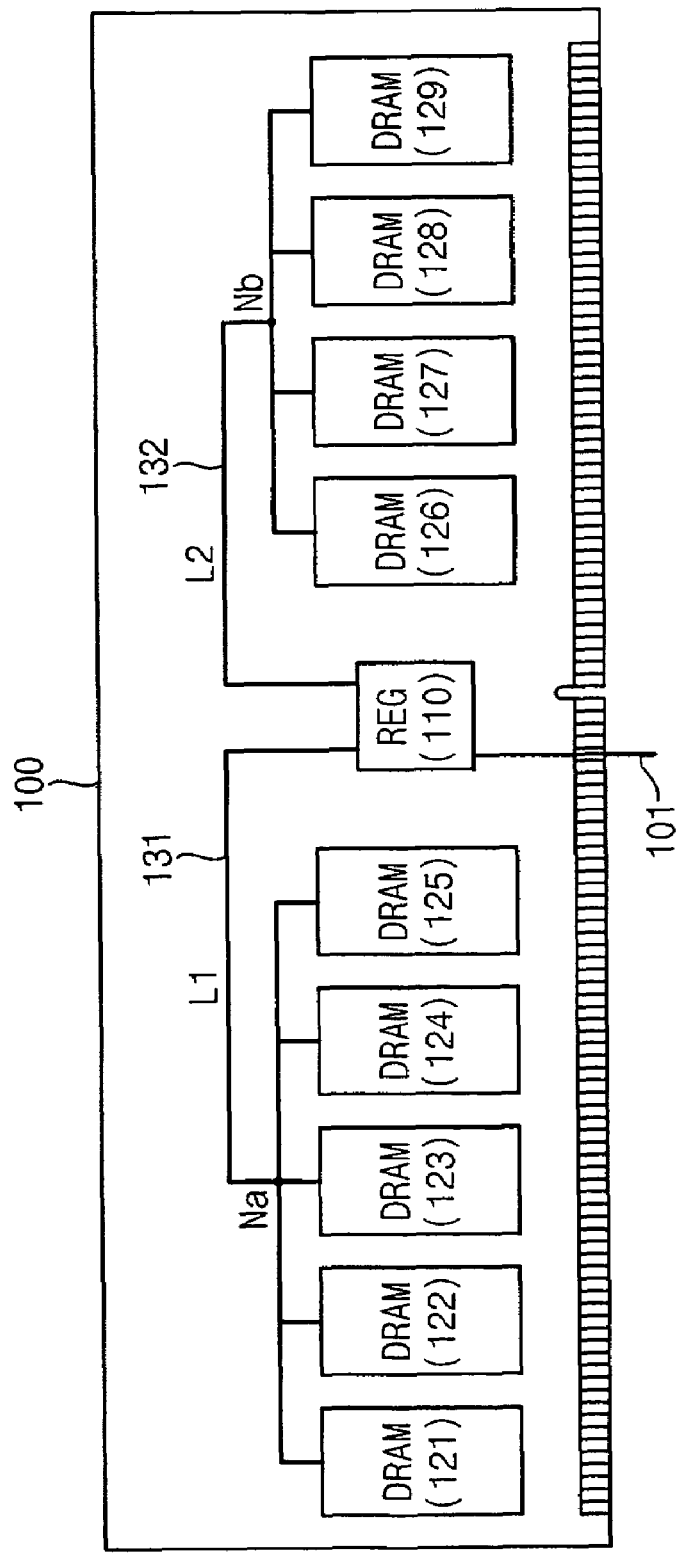
FIG. 1 is a block diagram illustrating a conventional memory module having a register.
Figure 2:
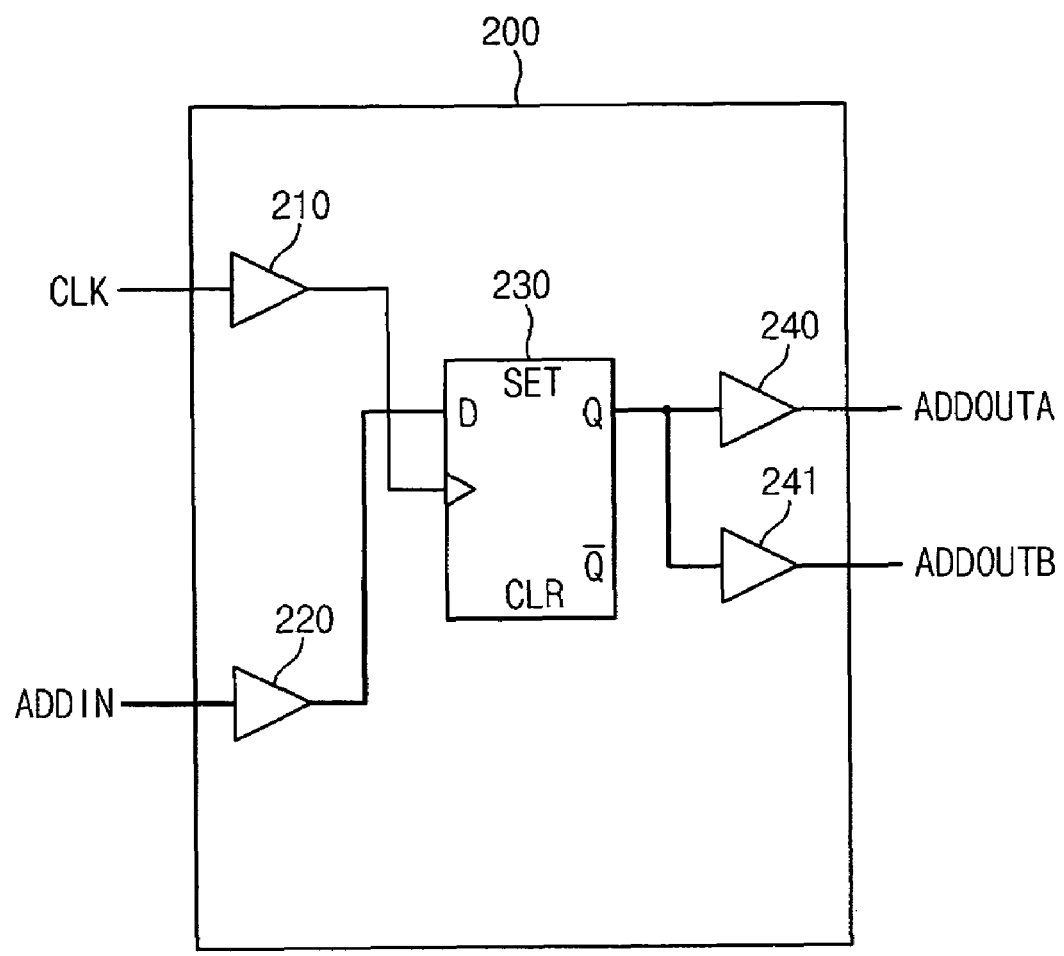
FIG. 2 is a block diagram illustrating a conventional 1:2 register.

Embodiments of the present invention now will be described more fully with reference to the accompanying drawings, in which embodiments of the invention are shown. This invention can, however, be embodied in many different forms and should not be construed as limited to the embodiments set forth herein. Like reference numerals refer to like elements throughout this application.

It will be understood that, although the terms first, second, etc. can be used herein to describe various elements, these elements should not be limited by these terms. These terms are used to distinguish one element from another. For example, a first element could be termed a second element, and, similarly, a second element could be termed a first element, without departing from the scope of the present invention. As used herein, the term "and/or" includes any and all combinations of one or more of the associated listed items.

It will be understood that when an element is referred to as being "on" or "connected" or "coupled" to another element, it can be directly on or connected or coupled to the other element or intervening elements can be present. In contrast, when an element is referred to as being "directly on" or "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular embodiments and is not intended to be limiting of the invention. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements, and/or components, but do not preclude the presence or addition of one or more other features, integers, steps, operations, elements, components, and/or groups thereof.

Figure 3:
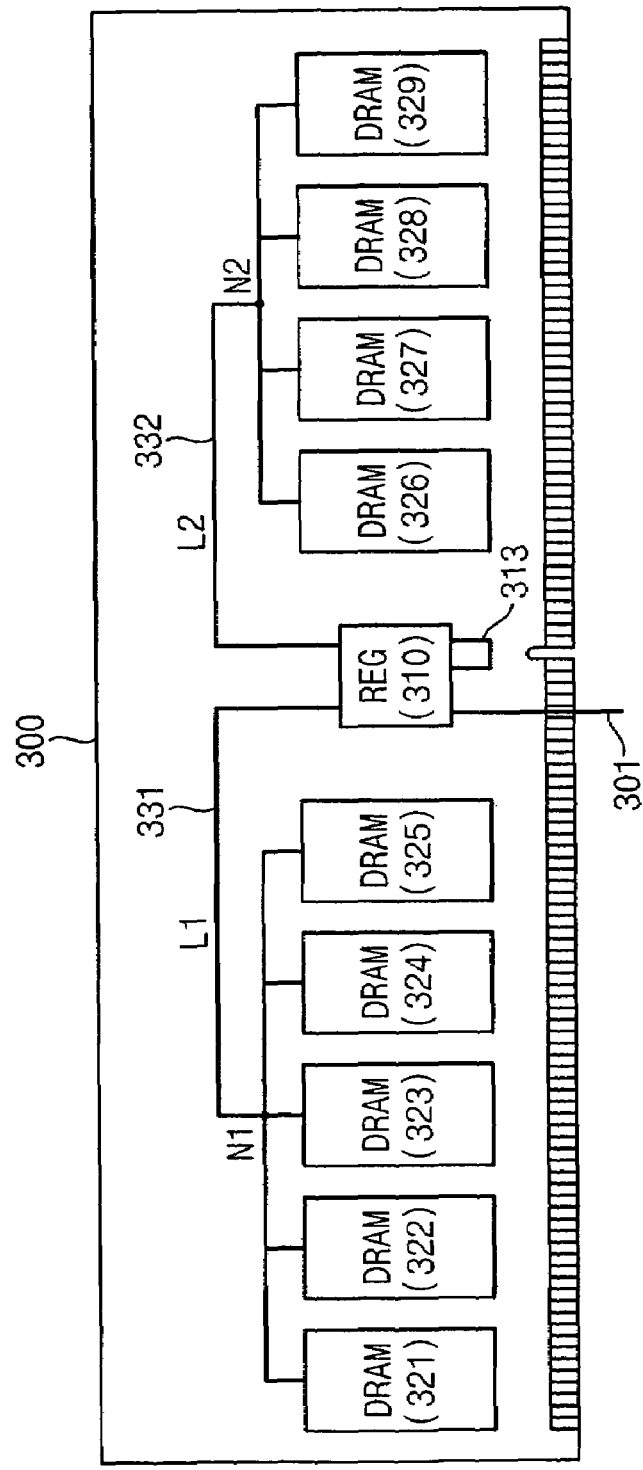
FIG. 3 is a block diagram illustrating an example embodiment of a memory module according to aspects of the present invention.

FIG. 3 is a block diagram illustrating an example embodiment of a memory module according to an aspect of the present invention.

Referring to FIG. 3, a memory module 300 includes nine memory devices 321 through 329 and a register 310. The register 310 receives a command/address signal through a command/address input line 301 from the exterior, and outputs the command/address signal and a delayed command/address signal. The register 310 provides the command/address signal to a first memory group through a first signal line 331 and a first node N1, and provides the delayed command/address signal to a second memory group through a second signal line 332 and a second node N2.

The first memory group includes five memory devices 321, 322, 323, 324 and 325, and the second memory group includes four memory devices 326, 327, 328 and 329. The number of the memory devices coupled to the first signal line 331 through the first node N1 is larger than the number of the memory devices coupled to the second signal line 332 through the second node N2, so that a delay amount through the first signal line 331 can be larger than a delay amount through the second signal line 332. Thus, the register 310 can provide the delayed command/address signal to the second signal line 332 so that a routing path of the second signal line 332 cannot be unnecessarily lengthened. Therefore, lengths of the first and second signal lines 331 and 332 in the memory module 300 can be minimized by using the delayed command/address signal.

The register 310 includes a delay circuit 313 to output the delayed command/address signal. A detailed configuration of the register 310 having the delay circuit 313 will be hereinafter described with reference to FIG. 4.

Figure 4:
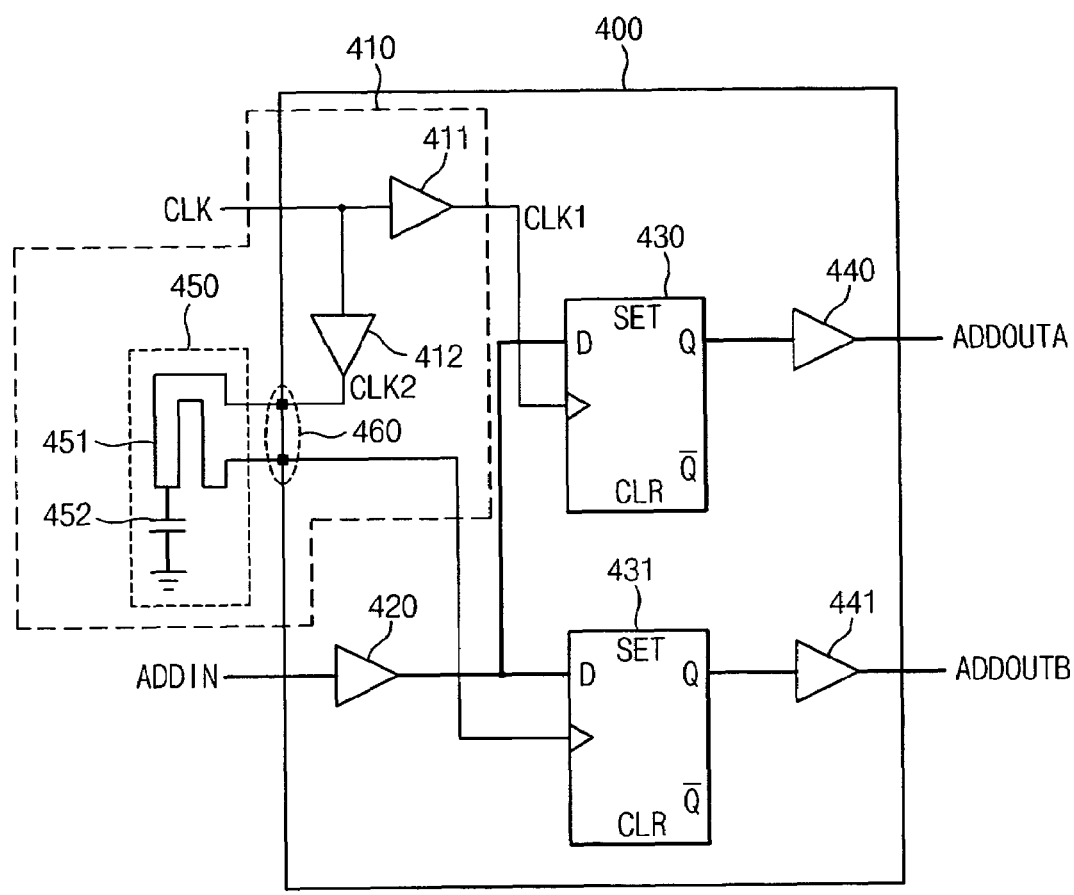
FIG. 4 is a block diagram illustrating an example embodiment of a 1:2 register according to aspects of the present invention.

FIG. 4 is a block diagram illustrating an embodiment of a 1:2 register according to aspects of the present invention.

Referring to FIG. 4, a 1:2 register 400 includes first and second latch circuits 430 and 431 that temporarily stores a command/address signal, a clock supply circuit 410 that provides a clock to the first and second latch circuits 430 and 431, respectively, and first and second output buffers 440 and 441 that buffer outputs from the first and second latch circuits 430 and 431, respectively. The 1:2 register 400 further includes a command/address input buffer 420.

The first and second latch circuits 430 and 431 can include D-type flip-flops. For example, when the command/address corresponds to an n-bit signal, the first and second latch circuits 430 and 431 include n flip-flops, where n indicates a natural number.

The command/address input buffer 420 receives a command/address signal from the exterior, and provides the command/address signal to the first and second latch circuits 430 and 431.

The clock supply circuit 410 includes a first clock buffer 411, a second clock buffer 412 and a delay circuit 450. The first clock buffer 411 receives an external clock signal CLK, and provides a first clock signal CLK1 to the first latch circuit 430, so that the first latch circuit 430 can output the command/address signal stored temporarily. For example, when the first latch circuit 430 includes n D-type flip-flops, the first clock signal CLK1 is provided to the n D-type flip-flops, respectively.

The second clock buffer 412 receives the external clock signal CLK, and provides a second clock signal CLK2 to the second latch circuit 431, so that the second latch circuit 431 can output the command/address signal stored temporarily. For example, when the second latch circuit 431 includes n D-type flip-flops, the second clock signal CLK2 is provided to the n D-type flip-flops, respectively.

The delay circuit 450 delays the second clock signal CLK2. In an example embodiment, the delay circuit 450 can be implemented on a printed circuit board (PCB) of the memory module as a transmission line 451 for elongating a length of a path where the second clock signal CLK2 is transferred to the second latch circuit 431. The delay circuit 450 can further include a capacitor 452 to delay the second clock signal CLK2. That is, in various embodiments the delay circuit 450 can include a capacitor and/or a resistor.

The external clock signal CLK that is inputted to the first and second clock buffers 411 and 412 can correspond to a differential signal. In this case, the first and second clock buffers 411 and 412 can receive the external signal CLK as a differential signal and respectively output the first clock signal CLK1 and the second clock signal CLK2 that are single-ended signals.

As mentioned above, the clock supply circuit 410 includes the first clock buffer 411 providing the first clock signal CLK1 to the first latch circuit 430 and the second clock buffer 412 providing the second clock signal CLK2 to the second latch circuit 431. However, it should be understood that it is illustrated as an example, and the clock supply circuit 410 can include only one clock buffer 411. For example, the first clock signal CLK1 can be provided to the delay circuit 450.

The delay circuit 450 can be implemented out of the 1:2 register 400, and the 1:2 register 400 can further include a terminal 460 connected to the delay circuit 450 so that a delay amount of the delay circuit 450 can be different according to a type of a memory module that includes the 1:2 register 400. However, it should be understood that it is illustrated as an example, and the delay circuit 450 can be implemented inside of the 1:2 register 400 in case that the 1:2 register is included in a memory module in which memory devices, a register, and circuit lines connecting the memory devices and the register are predetermined.

The first output buffer 440 buffers the command/address signal outputted from the first latch circuit 430 to provide a buffered output ADDOUTA to the first memory group of the memory module. The second output buffer 441 buffers the delayed command/address signal outputted from the second latch circuit 431 to provide a buffered delayed output ADDOUTB to the second memory group of the memory module.

Figure 5:
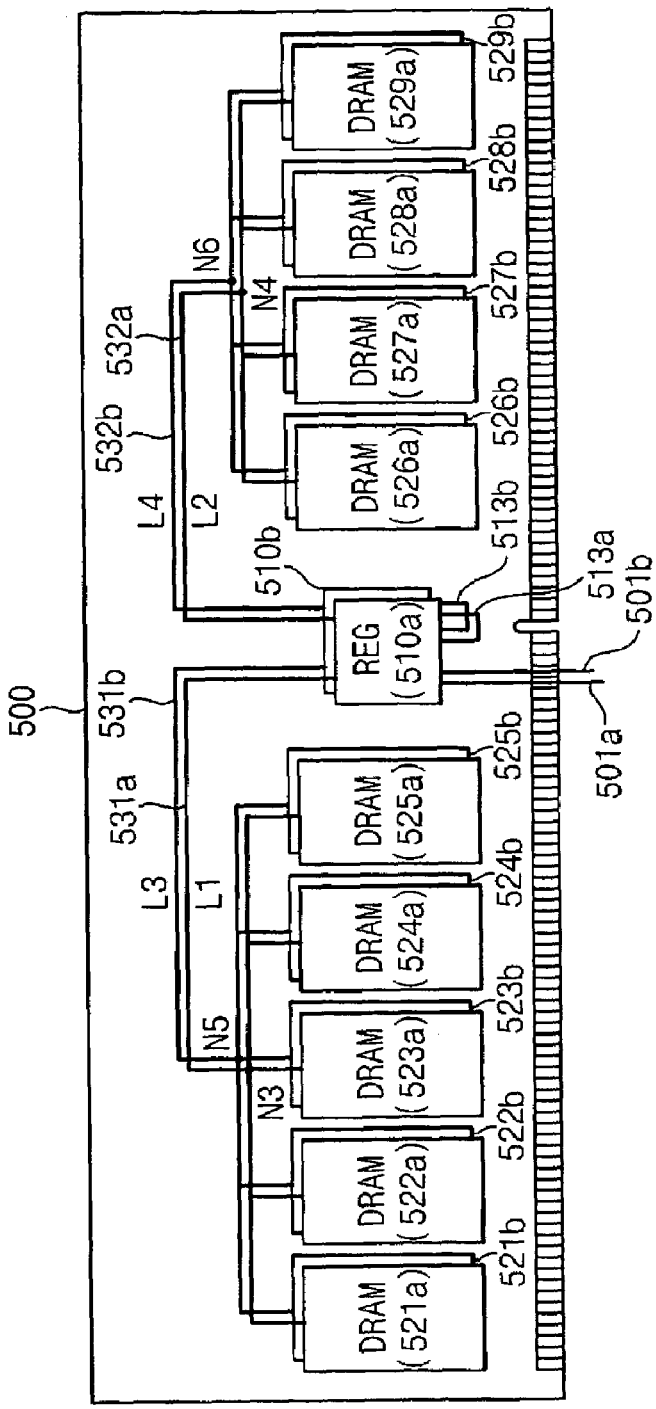
FIG. 5 is a block diagram illustrating another example embodiment of a memory module according to another aspect of the present invention.

FIG. 5 is a block diagram illustrating another embodiment of a memory module according to aspects of the present invention. Referring to FIG. 5, a memory module 500 includes nine memory devices 521a through 529a and a register 510a on a first side of the memory module 500 and nine memory devices 521b through 529b and a register 510b on a second side of the memory module 500. The two registers 510a and 510b can correspond to 1:2 registers.

On the first side of the memory module 500, the register 510a receives a command/address signal through a command/address input line 501a from the exterior. The register 510a provides the command/address signal to a first memory group including the memory devices 521a through 525a through a first signal line 531a and a third node N3, and provides the command/address signal that is delayed by a delay circuit 513a to a second memory group including the memory devices 526a through 529a through a second signal line 532a and a fourth node N4. The delay circuit 513a delays the command/address signal on the first side of the memory module 500.

Similarly, on the second side of the memory module, the register 510b receives the command/address signal through a command/address input line 501b from the exterior. The register 510b provides the command/address signal to a third memory group including the memory devices 521b through 525b through a third signal line 531b and a fifth node N5, and provides the command/address signal that is delayed by a delay circuit 513b to a fourth memory group including the memory devices 526b through 529b through a fourth signal line 532b and a sixth node N6. The delay circuit 513b delays the command/address signal on the second side of the memory module 500.

As described above, the memory module 500 can include the two 1:2 registers 510a and 510b for the two sides thereof. However, a memory module can include one 1:4 register as follows.

Figure 6:
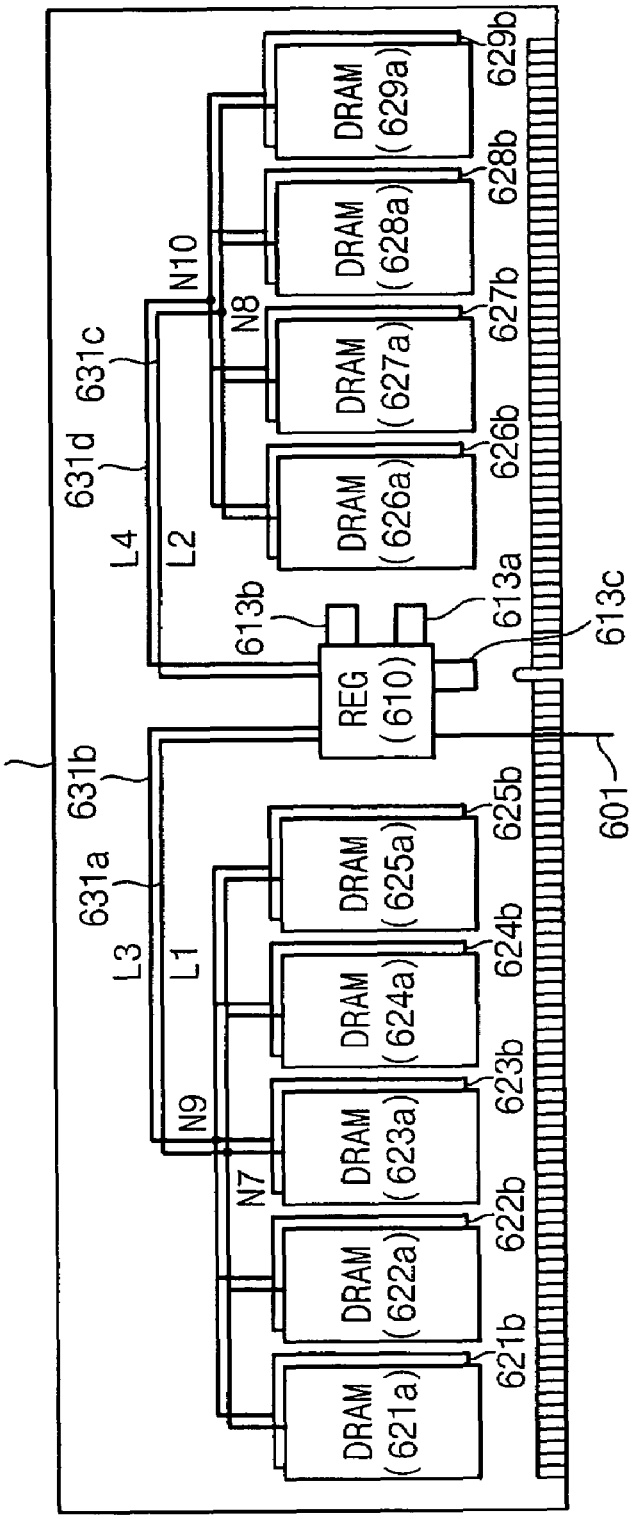
FIG. 6 is a block diagram illustrating still another example embodiment of a memory module according to aspects of the present invention.

FIG. 6 is a block diagram illustrating still another example embodiment of a memory module according to aspects of the present invention. Referring to FIG. 6, a memory module 600 includes nine memory devices 621a through 629a on a first side of the memory module 600 and nine memory devices 621b through 629b on a second side of the memory module 600 and one register 610 on the first side of the memory module 600. The register 610 can correspond to a 1:4 register. The 1:4 register will be described in detail with reference to FIG. 6.

The register 610 outputs four command/address signals through first, second, third and fourth signal lines 631a, 631b, 631c and 631d, wherein the four command/address signals have respective delay amounts. The memory module 600 includes three delay circuits 613a, 613b and 613c so that the delay amounts of the four command/address signals can be controlled differently from each other.

Figure 7:
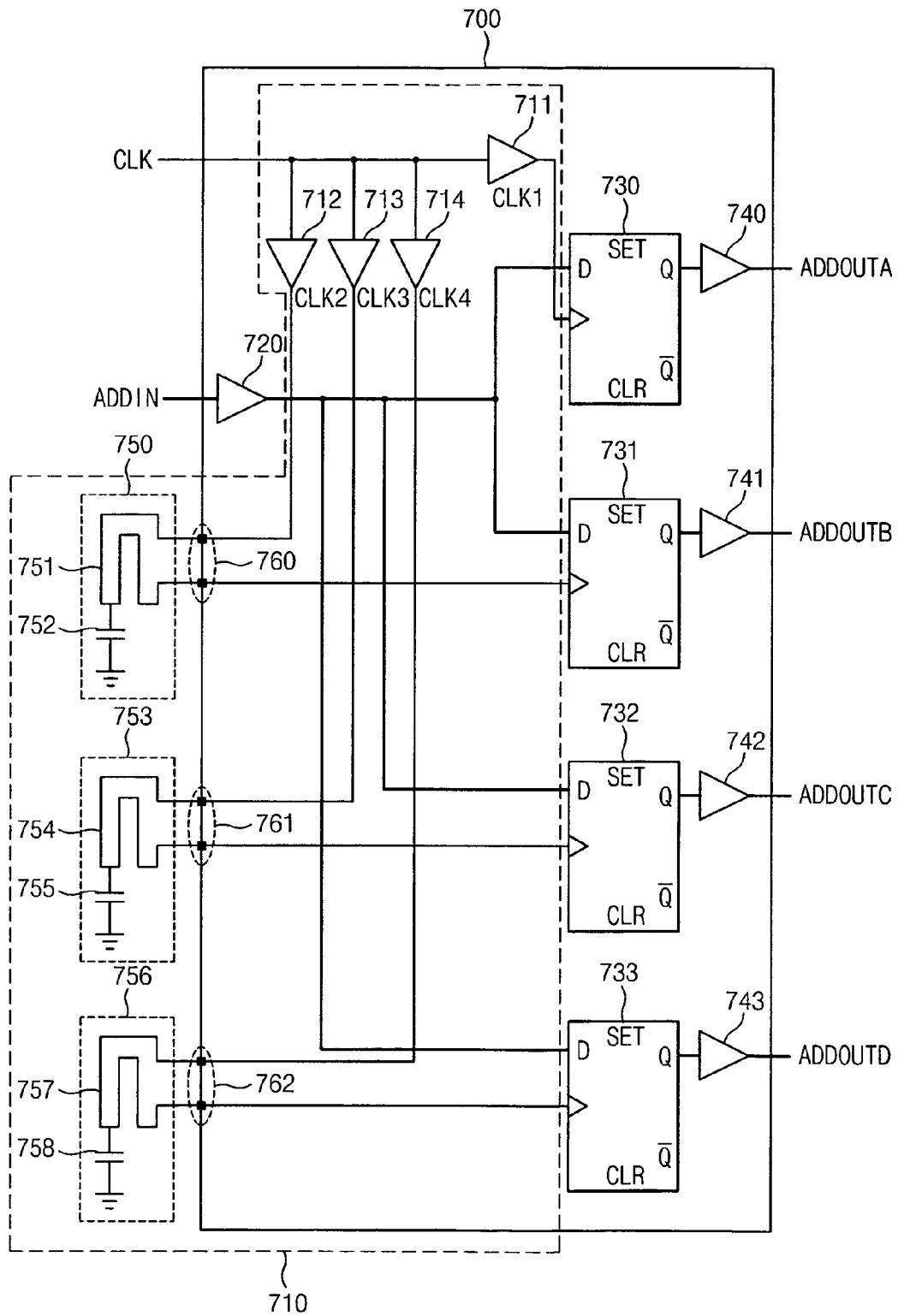
FIG. 7 is a block diagram illustrating still another example embodiment of a 1:4 register according to aspects of the present invention.

FIG. 7 is a block diagram illustrating a 1:4 register according to example embodiments of the present invention. Referring to FIG. 7, a 1:4 register 700 includes four latch circuits 730, 731, 732 and 733 that respectively store a command/address signal temporarily, a clock supply circuit 710 that provides a clock to the four latch circuits 730, 731, 732 and 733, and four output buffers 740, 741, 742 and 743 that buffer outputs from the four latch circuits 730, 731, 732 and 733, respectively. The 1:4 register 700 further includes a command/address input buffer 720.

Similarly to the 1:2 register 400 in FIG. 4, the four latch circuits 730, 731, 732 and 733 can include D-type flip-flops, respectively. For example, when a command/address signal corresponds to an n-bit signal, the four latch circuits 730, 731, 732 and 733 include n flip-flops, respectively. The command/address input buffer 720 receives an external command/address signal ADDIN, and provides the external command/address signal ADDIN to the four latch circuits 730, 731, 732 and 733. The clock supply circuit 710 includes four clock buffers 711, 712, 713 and 714, and three delay circuits 750, 753 and 756.

A first clock buffer 711 receives the external clock signal CLK, and provides a first clock signal CLK1 to a first latch circuit 730, so that the first latch circuit 730 outputs the command/address signal temporarily stored therein. For example, when the first latch circuit 730 includes n D-type flip-flops, the first clock signal CLK1 is provided to the n D-type flip-flops, respectively.

A second clock buffer 712 receives the external clock signal CLK, and provides a second clock signal CLK2 to a second latch circuit 731, so that the second latch circuit 731 outputs the command/address signal temporarily stored therein. For example, when the second latch circuit 731 includes n D-type flip-flops, the second clock signal CLK2 is provided to the n D-type flip-flops, respectively.

A third clock buffer 713 receives the external clock signal CLK, and provides a third clock signal CLK3 to a third latch circuit 732 so that the third latch circuit 732 outputs the command/address signal temporarily stored therein. For example, when the third latch circuit 732 includes n D-type flip-flops, the third clock signal CLK3 is provided to the n D-type flip-flops, respectively.

A fourth clock buffer 714 receives the external clock signal CLK, and provides a fourth clock signal CLK4 to a fourth latch circuit 733 so that the fourth latch circuit 733 outputs the command/address signal temporarily stored therein. For example, when the fourth latch circuit 733 includes n D-type flip-flops, the fourth clock signal CLK4 is provided to the n D-type flip-flops, respectively.

The three delay circuits 750, 753 and 756 delay the second, third and fourth clock signals CLK2, CLK3 and CLK4, respectively. In various example embodiments, the three delay circuits 750, 753 and 756 can be implemented on a PCB of a memory module as transmission lines 751, 754 and 757, respectively. The delay circuits 750, 753 and 756 can further include capacitors 752, 755 and 758, respectively. Each of the delay circuits 750, 753 and 756 can be implemented as a capacitor and/or a resistor, as examples.

In various example embodiments, the external clock signal CLK that is inputted to the first through fourth clock buffers 711, 712, 713 and 714 can correspond to a differential signal. The register 700 in FIG. 7 includes the first through fourth clock buffers 711, 712, 713 and 714. However, it should be understood that it is illustrated as an example. The register 700 can include some of the first through fourth clock buffers 711, 712, 713 and 714.

For example, the second and fourth clock buffers 712 and 714 can be omitted so that the first clock signal CLK1 can be provided to a first delay circuit 750 and the third clock signal CLK3 can be provided to a third delay circuit 756. In addition, the second through fourth clock buffer 712, 713 and 714 can be omitted so that the first clock signal CLK1 can be provided to the first, second and third delay circuits 750, 753 and 756.

The three delay circuits 750, 753 and 756 can be implemented out of the 1:4 register 700, and the 1:4 register 700 can further include terminals 760, 761 and 762 connected to the three delay circuits 750, 753 and 756, respectively, so that delay amounts of the three delay circuits 750, 753 and 756 can be different from each other according to a type of a memory module that includes the 1:4 register 700. However, it should be understood that it is illustrated as an example, and the three delay circuits 750, 753 and 756 can be implemented inside of the 1:4 register 700 when the 1:4 register is included in a memory module in which memory devices, a register and circuit lines connecting the memory devices and the register are predetermined.

Figure 8:
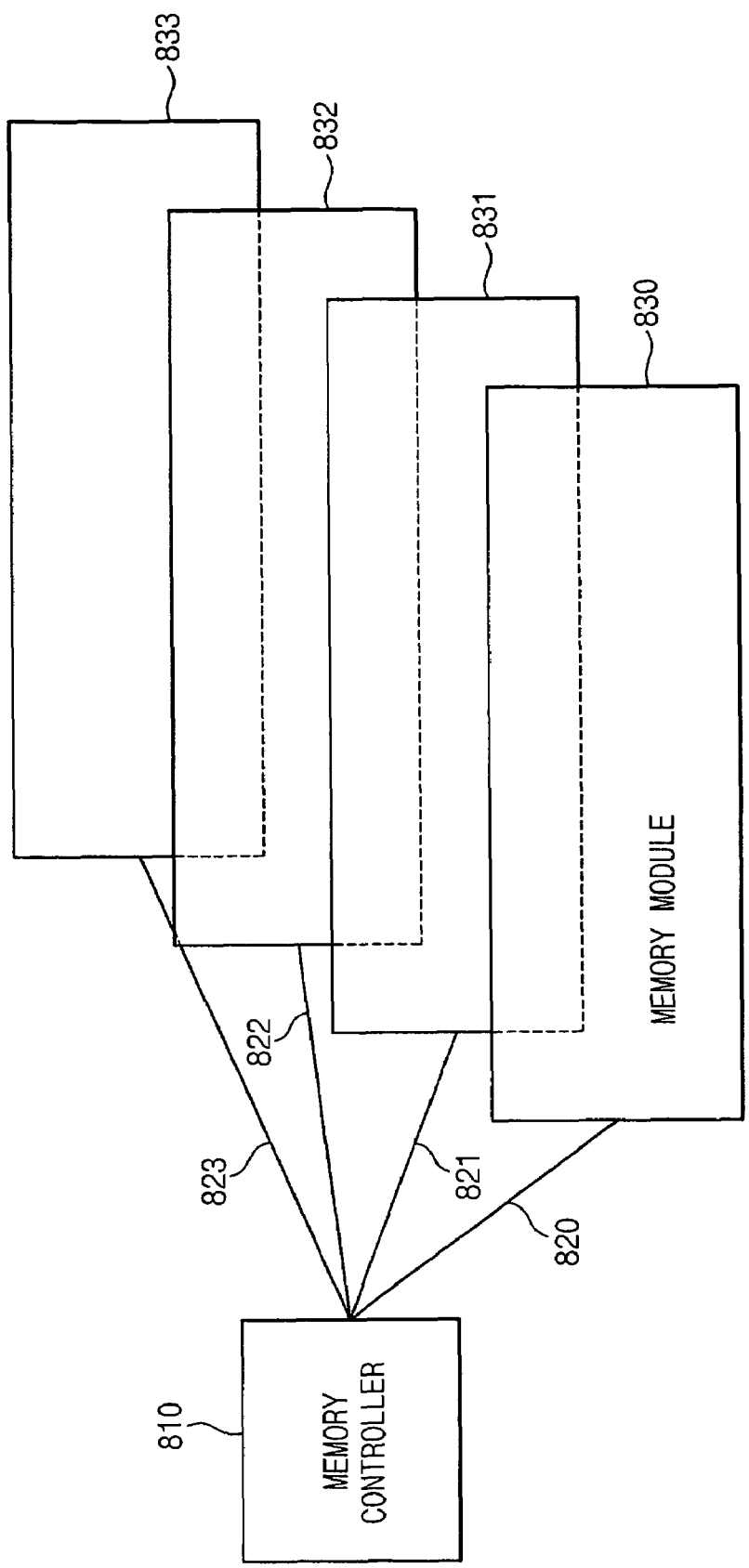
FIG. 8 is a block diagram illustrating still another example embodiment of a memory system having a plurality of memory modules according to aspects of the present invention.

FIG. 8 is a block diagram illustrating an example embodiment of a memory system having a plurality of memory modules according to aspects of the present invention. The memory system can include a memory controller and at least one memory module.

Referring to FIG. 8, the memory system includes four memory modules 830, 831, 832 and 833 and a memory controller 810 that provides a command/address signal to the four memory modules 830, 831, 832 and 833 through four lines 820, 821, 822 and 823, respectively.

In case of equalizing lengths of the four lines 820, 821, 822 and 823, lengths of routing paths of the four lines 820, 821, 822 and 823 can be increased. Therefore, there is a need for a technique in which the routing paths between the memory controller and the memory modules can be minimized in synchronization with the command/address signal.

Figure 9:
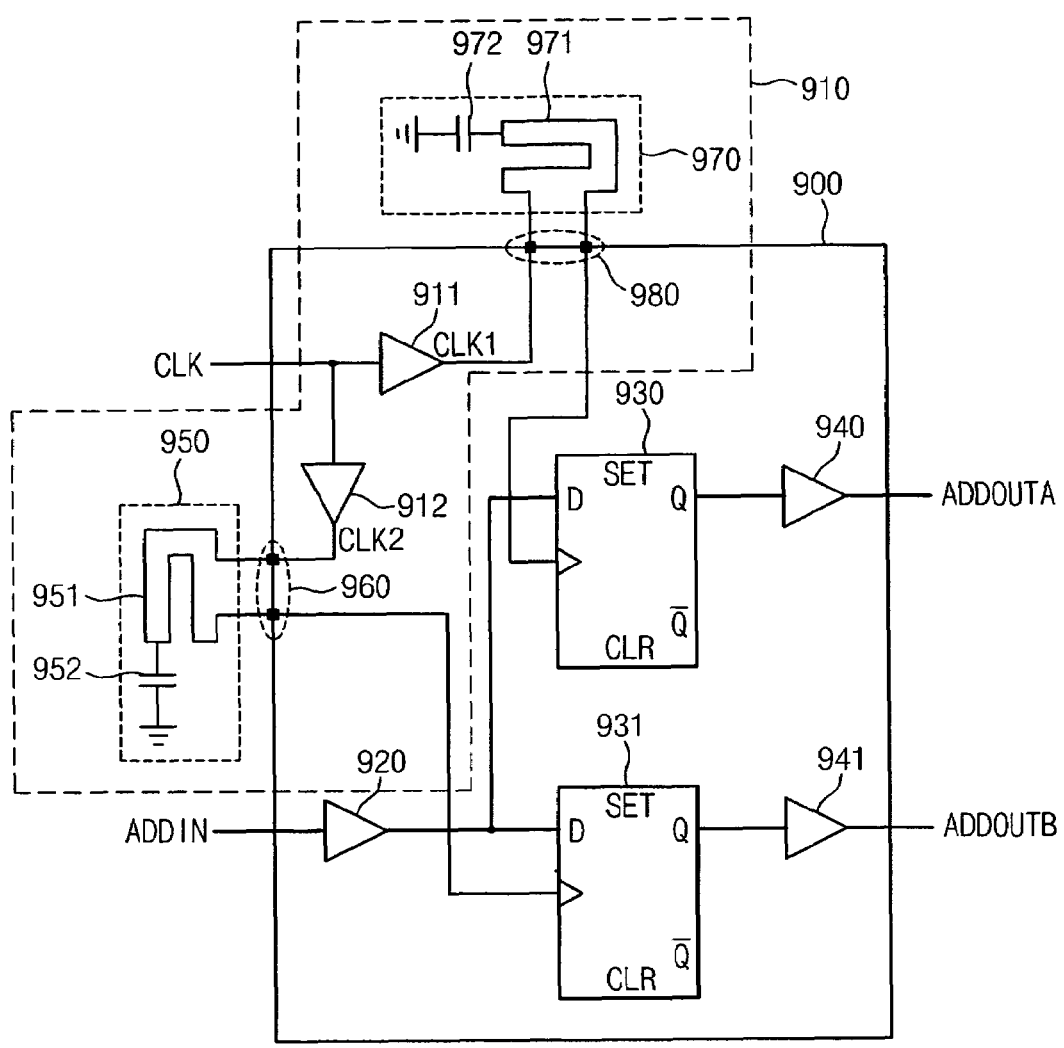
FIG. 9 is a block diagram illustrating another example embodiment a 1:2 register according to aspects of the present invention.

FIG. 9 is a block diagram illustrating another example embodiment of a 1:2 register according to aspects of the present invention. Referring to FIG. 9, a 1:2 register 900 includes first and second latch circuits 930 and 931 that temporarily store a command/address signal, a clock supply circuit 910 that provides a clock to the first and second latch circuits 930 and 931, and first and second output buffers 940 and 941 that buffer outputs of the first and second latch circuits 930 and 931, respectively. The 1:2 register 900 further includes a command/address input buffer 920. The command/address input buffer 920 receives an external command/address signal ADDIN, and provides the command/address signal to the first and second latch circuits 930 and 931.

The clock supply circuit includes a first clock buffer 911, a second clock buffer 912 and first and second delay circuits 950 and 970.

The first clock buffer 910 receives an external clock signal CLK, and provides a first clock signal CLK1 to the first latch circuit 930 through the second delay circuit 970, so that the first latch circuit 930 can output the temporarily stored command/address signal in response to the first clock signal delayed by the second delay circuit 970. For example, when the first latch circuit 930 includes n D-type flip-flops, the first clock signal is provided to the n D-type flip-flops, respectively.

The second clock buffer 911 receives the external clock signal CLK, and provides a second clock signal CLK2 to the second latch circuit 931 through the first delay circuit 950, so that the second latch circuit 931 can output the temporarily stored command/address signal in response to the second clock signal delayed by the first delay circuit 950. For example, when the second latch circuit 931 includes n D-type flip-flops, the second clock is provided to the n D-type flip-flops, respectively.

The first delay circuit 950 delays the second clock signal CLK2 to reduce a mismatch between memory groups in a memory module. In an example embodiment, the first delay circuit 950 is implemented on a PCB of the memory module as a transmission line 951 elongating a length of a path where the second clock signal CLK2 is transferred to the second latch circuit 931. The first delay circuit 950 can include a capacitor 952 to delay the second clock signal CLK2. The first delay circuit 950 can include a capacitor and/or a resistor.

The second delay circuit 970 delays the first clock signal CLK1 to reduce a mismatch between the memory groups in a memory module. In an example embodiment, the second delay circuit 970 is implemented on the PCB of the memory module as a transmission line 971 elongating a length of a path where the first clock signal CLK1 is transferred to the first latch circuit 930. The second delay circuit 970 can include a capacitor 972 to delay the first clock signal CLK1. The second delay circuit 970 can include a capacitor and/or a resistor.

In an example embodiment, the external clock signal CLK that is inputted to the first and second clock buffers 911 and 912 can correspond to a differential signal. In this case, the first and second clock buffers 911 and 912 receive the external clock signal CLK as a differential signal and output the first and second clock signals CLK1 and CLK2 that are single-ended signals, respectively.

Accordingly, the 1:2 register 900 enables reduction of the mismatch between the memory groups in the memory module by using the first delay circuit 950 and also enables reduction of the mismatch between the memory modules in the memory system by using the second delay circuit 970.

Figure 10:
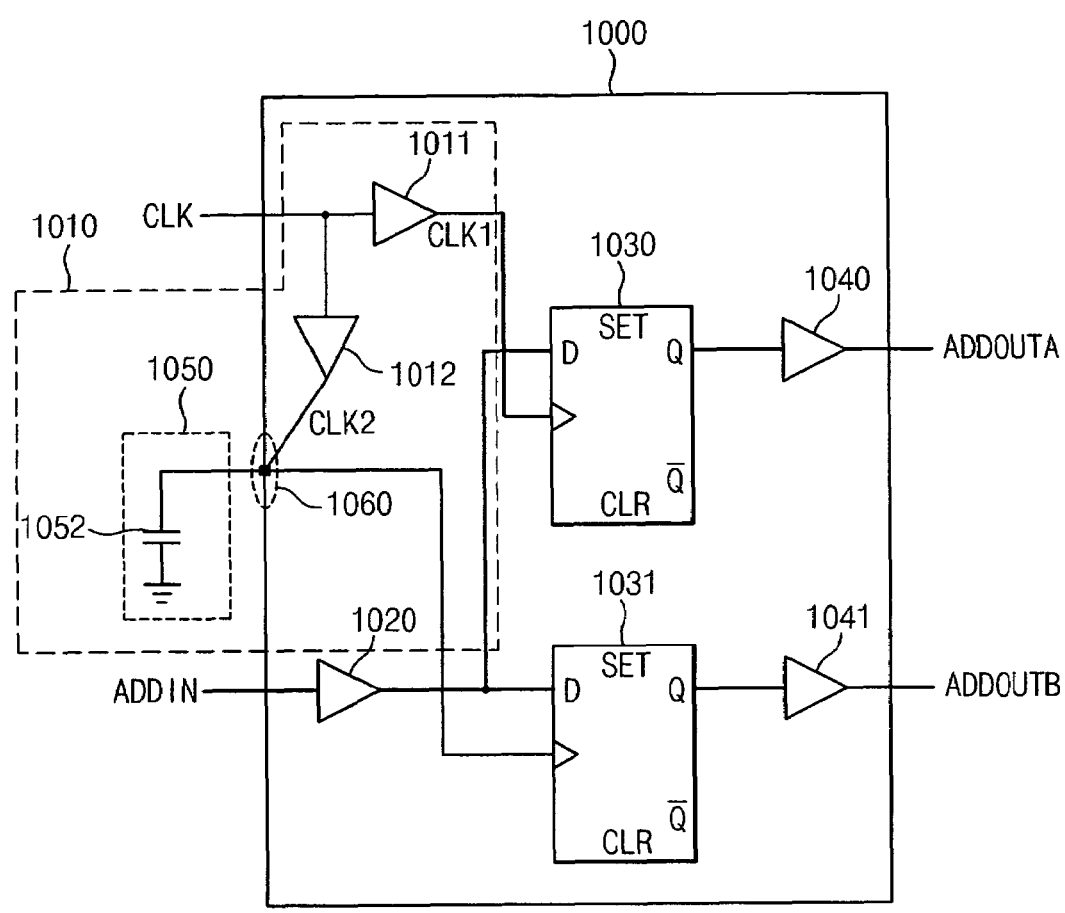
FIG. 10 is a block diagram illustrating still another example embodiment of a 1:2 register according to aspects of the present invention.

FIG. 10 is a block diagram illustrating still another example embodiment of a 1:2 register according to aspects of the present invention. Referring to FIG. 10, a 1:2 register 1000 includes first and second latch circuits 1030 and 1031, a clock supply circuit 1010 that provides a clock to the first and second latch circuits 1030 and 1031, and first and second output buffers 1040 and 1041 that buffer outputs from the latch circuits 1030 and 1031, respectively. The 1:2 register 1000 further includes a command/address input buffer 1020.

The first and second latch circuits 1030 and 1031 can include D-type flip-flops. For example, when a command/address signal corresponds to an n-bit signal, the first and second latch circuits 1030 and 1031 can include n flip-flops, respectively. The command/address input buffer 1020 receives a command/address signal ADDIN from the exterior, and provides the command/address signal ADDIN to the first and second latch circuits 1030 and 1031.

The clock supply circuit 1010 includes a first clock buffer 1011, a second clock buffer 1012 and a delay circuit 1050.

The first clock buffer 1011 receives an external clock signal CLK, and provides a first clock signal CLK1 to the first latch circuit 1030, so that the first latch circuit 1030 can output the temporarily stored command/address signal. For example, when the first latch circuit 1030 includes n D-type flip-flops, the first clock signal CLK1 is provided to the n D-type flip-flops, respectively.

The second clock buffer 1012 receives the external clock signal CLK, and provides a second clock signal CLK2 to the second latch circuit 1031 through the delay circuit 1050, so that the second latch circuit 1031 can output the temporarily stored command/address signal in response to the second clock signal delayed by the delay circuit 1050. For example, when the second latch circuit 1031 includes n D-type flip-flops, the second clock signal CLK2 is provided to the n D-type flip-flops, respectively.

A terminal 1060 connected to the delay circuit 1050 can include one pin, unlike the terminal 460 in FIG. 4, so that the delay circuit 1050 can include a capacitor 1052.

The external clock signal CLK inputted to the first clock buffer 1011 and the second clock buffer 1012 can correspond to a differential signal. In this case, the first clock buffer 1011 and the second clock buffer 1012 receive the external clock signal CLK as the differential signal, and respectively output the first clock signal CLK1 and the second clock signal CLK2 that are single-ended signals.

As described above, the clock supply circuit 1010 can include the first clock buffer 1011 that supplies the first clock signal CLK1 to the first latch circuit 1030 and the second clock buffer 1012 that supplies the second clock signal CLK2 to the second latch circuit 1031. However, it should be understood that it is illustrated as an example, and the clock supply circuit 1010 can include only one clock buffer. For example, the clock supply circuit can include only the first clock buffer 1011 so that the delay circuit 1050 can be provided with the first clock signal CLK1.

As described above, a memory module according to example embodiments of the present invention can be implemented to have a command/address signal line of a short routing path so that the memory module can have a small area. Accordingly, interference between signals can be reduced.

Further, a register according to example embodiments of the present invention can provide a command/address signal and a delayed command/address signal so that a routing path of a command/address signal line can be minimized.

In the drawings and specification of the disclosure, any component or element can be embodied as a plurality of components or elements having more detailed functions, and also a plurality of components or elements having any function are embodied as one component or element. For example, although the latch circuit in the drawings and specification is embodied as a plurality of D-type flip-flops configured to temporarily store one bit, respectively, the latch circuit can be embodied as one circuit receiving all command/address signals in parallel to temporarily store the command/address signals.

While the example embodiments and their advantages have been described in detail, it should be understood that various changes, substitutions and alterations can be made herein without departing from the scope of the invention, and that the embodiments and invention may be applied in numerous applications, only some of which have been described herein. It is intended by the following claims to claim that which is literally described and all equivalents thereto, including all modifications and variations that fall within the scope of each claim.

What is claimed is:

1. A register comprising:
a first latch circuit having a first input terminal coupled to a node, the first latch circuit configured to temporarily store a command/address signal;
a second latch circuit having a second input terminal coupled to the node, the second latch circuit configured to temporarily store the command/address signal; and
a clock supply circuit configured to generate a first clock signal that is provided to the first latch circuit, and a second clock signal that is delayed with respect to the first clock signal and provided to the second latch circuit, wherein the first latch circuit outputs the command/address signal in synchronization with the first clock signal, and the second latch circuit outputs the command/address signal in synchronization with the second clock signal.

2. The register of claim 1, wherein the first latch circuit and the second latch circuit each comprises a plurality of D-type flip-flops.

3. The register of claim 1, further comprising:
a first output buffer configured to buffer the command/address signal outputted from the first latch circuit; and
a second output buffer configured to buffer the command/address signal outputted from the second latch circuit.

4. The register of claim 1, wherein the clock supply circuit comprises:
a first path configured to receive an external clock signal to provide the first clock signal to the first latch circuit; and
a second path configured to receive the external clock signal to provide the second clock signal to the second latch circuit.

5. The register of claim 1, wherein the register has a configuration of one input terminal and two output terminals configured to receive one command/address signal and output two command/address signals.

6. The register of claim 4, wherein the first path comprises a first clock buffer configured to receive the external clock signal to output the first clock signal, and
the second path comprises a second clock buffer configured to receive the external clock signal to output the second clock signal and a delay circuit configured to delay the second clock signal.

7. The register of claim 4, wherein the external clock signal corresponds to a differential signal.

8. A memory module comprising:
a first memory group including a plurality of memory devices;
a second memory group including a number of memory devices less than the number of the memory devices in the first memory group;
a register configured to output a command/address signal and a delayed command/address signal, the delayed command/address signal being a signal that is delayed with respect to the command/address signal;
a first signal line configured to transfer the command/address signal to the first memory group; and
a second signal line configured to transfer the delayed command/address signal to the second memory group.

9. The memory module of claim 8, wherein the second signal line is shorter than the first signal line.

10. The memory module of claim 8, wherein the register comprises:
a first latch circuit having a first input terminal coupled to a node, the first latch circuit configured to temporarily store the command/address signal;
a second latch circuit having a second input terminal coupled to the node, the second latch circuit configured to temporarily store the command/address signal; and
a clock supply circuit configured to generate a first clock signal that is provided to the first latch circuit, and a second clock signal that is delayed with respect to the first clock signal and provided to the second latch circuit, wherein the first latch circuit outputs the command/address signal in synchronization with the first clock signal, and the second latch circuit outputs the delayed command/address signal in synchronization with the second clock signal.

11. The memory module of claim 10, wherein the first latch circuit and the second latch circuit each comprises a plurality of D-type flip-flops.

12. The memory module of claim 10, wherein the register further comprises:
a first output buffer configured to buffer the command/address signal outputted from the first latch circuit; and
a second output buffer configured to buffer the delayed command/address signal outputted from the second latch circuit.

13. The memory module of claim 10, wherein the clock supply circuit comprises:
a first path configured to receive an external clock signal to provide the first clock signal to the first latch circuit; and
a second path configured to receive the external clock signal to provide the second clock signal to the second latch circuit.

14. The memory module of claim 13, wherein the first path comprises a first clock buffer configured to receive the external clock signal to output the first clock signal, and
the second path comprises a second clock buffer configured to receive the external clock signal to output the second clock signal, and a first delay circuit configured to delay the second clock signal.

15. The memory module of claim 14, wherein the first path further comprises a second delay circuit configured to delay the first clock signal.

16. The memory module of claim 14, wherein the external clock signal corresponds to a differential signal.

17. A memory system comprising:
a memory module which comprises:
a first memory group including a plurality of memory devices;
a second memory group including a number of memory devices less than the number of the memory devices in the first memory group;
a register configured to receive a command/address signal from the exterior and configured to output the command/address signal and a delayed command/address signal, the delayed command/address signal being a signal that is delayed with respect to the command/address signal;
a first signal line configured to transfer the command/address signal to the first memory group; and
a second signal line configured to transfer the delayed command/address signal to the second memory group; and
a memory controller configured to provide the command/address signal from the exterior to the register.

18. The memory system of claim 17, wherein the second signal line is shorter than the first signal line.

19. The memory system of claim 17, wherein the register comprises:
a first latch circuit having a first input terminal coupled to a node, the first latch circuit configured to temporarily store a command/address signal;
a second latch circuit having a second input terminal coupled to the node, the second latch circuit configured to temporarily store the command/address signal; and
a clock supply circuit configured to generate a first clock signal that is provided to the first latch circuit, and a second clock signal that is delayed with respect to the first clock signal and provided to the second latch circuit, wherein the first latch circuit outputs the command/address signal in synchronization with the first clock signal, and the second latch circuit outputs the delayed command/address signal in synchronization with the second clock signal.

20. The memory system of claim 19, wherein the first latch circuit and the second latch circuit each comprises a plurality of D-type flip-flops.

21. The memory system of claim 19, wherein the register further comprises:
- a first output buffer configured to buffer the command/address signal outputted from the first latch circuit; and
- a second output buffer configured to buffer the delayed command/address signal outputted from the second latch circuit.

22. The memory system of claim 19, wherein the clock supply circuit comprises:
- a first path configured to receive an external clock signal to provide the first clock signal to the first latch circuit; and
- a second path configured to receive the external clock signal to provide the second clock signal to the second latch circuit.

23. The memory system of claim 22, wherein the first path comprises a first clock buffer configured to receive the external clock signal to output the first clock signal, and
the second path comprises a second clock buffer configured to receive the external clock signal to output the second clock signal, and a first delay circuit configured to delay the second clock signal.

24. The memory system of claim 23, wherein the first path further comprises a second delay circuit configured to delay the first clock signal.

25. The memory system of claim 23, wherein the external clock signal corresponds to a differential signal.

* * * * *

UNITED STATES PATENT AND TRADEMARK OFFICE
CERTIFICATE OF CORRECTION

PATENT NO. : 7,652,949 B2 Page 1 of 1
APPLICATION NO. : 11/633353
DATED : January 26, 2010
INVENTOR(S) : Yoon et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 350 days.

Signed and Sealed this

Twenty-third Day of November, 2010

David J. Kappos
*Director of the United States Patent and Trademark Office*